US009894773B2

(12) United States Patent
Robertson et al.

(10) Patent No.: US 9,894,773 B2
(45) Date of Patent: Feb. 13, 2018

(54) ADDING TEST ACCESS TO A BACK-DRILLED VIA

(71) Applicant: International Business Machines Corporation, Armonk, NY (US)

(72) Inventors: Derek Robertson, Durham, NC (US); Vincent M. Rogers, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 831 days.

(21) Appl. No.: 14/109,206

(22) Filed: Dec. 17, 2013

(65) Prior Publication Data

US 2015/0173201 A1 Jun. 18, 2015

(51) Int. Cl.
| | |
|---|---|
| *H05K 3/00* | (2006.01) |
| *H05K 1/02* | (2006.01) |
| *H05K 3/42* | (2006.01) |

(52) U.S. Cl.
CPC ......... *H05K 3/0047* (2013.01); *H05K 1/0251* (2013.01); *H05K 3/429* (2013.01); *H05K 2201/09845* (2013.01); *Y10T 29/49165* (2015.01)

(58) Field of Classification Search
CPC .... H05K 3/0047; H05K 3/429; H05K 1/0251; Y10T 29/49165
See application file for complete search history.

(56) References Cited

U.S. PATENT DOCUMENTS

| | | | | |
|---|---|---|---|---|
| 4,975,142 A | * | 12/1990 | Iannacone | H05K 1/0203 216/18 |
| 5,200,695 A | * | 4/1993 | Kazama | G01R 1/067 324/72.5 |
| 6,323,667 B1 | * | 11/2001 | Kazama | G01R 1/06722 324/755.05 |
| 7,364,461 B1 | * | 4/2008 | Back | H01R 9/0515 439/329 |
| 7,669,321 B1 | | 3/2010 | Levy et al. | |
| 8,201,328 B2 | * | 6/2012 | Yaghmai | G01R 31/2889 29/830 |

(Continued)

FOREIGN PATENT DOCUMENTS

| | | |
|---|---|---|
| CN | 201937952 | 8/2011 |
| WO | 2010127496 | 11/2010 |

*Primary Examiner* — Peter DungBa Vo
*Assistant Examiner* — Jeffrey T Carley
(74) *Attorney, Agent, or Firm* — Lieberman & Brandsdorfer, LLC

(57) ABSTRACT

Embodiments of the invention relates to adding test access to a back-drilled vertical access interconnect (VIA) of a printed circuit board (PCB). A VIA is either formed or provided as an opening through layers of the PCB. The VIA is countersunk from one of the two openings to the PCB prior to plating to form a surface that can be used as a test target. The countersunk VIA is subject to plating so that the interior walls and surfaces of the VIA are covered with a conductive material. The plating is removed along the walls of the countersunk section of the VIA, so that the plating remains on the shoulders and the non-countersunk section of the VIA with the shoulder in communication with a trace internal to the PCB. The back-drilled VIA with the plating configuration provides an internal conducting surface for contact while mitigating interference associated with a VIA stub.

18 Claims, 5 Drawing Sheets

(56) References Cited

U.S. PATENT DOCUMENTS 8,302,301 B2 * 11/2012 Lau ..................... H05K 1/0251
174/262
2008/0217052 A1 9/2008 Matsui
2011/0240348 A1 * 10/2011 Lau ..................... H05K 1/0251
174/257

* cited by examiner

ADDING TEST ACCESS TO A BACK-DRILLED VIA

BACKGROUND

The present invention relates to modification to a vertical interconnect access (VIA) of a printed circuit board to mitigate or eliminate signal integrity degradation caused by a conductive stub. More specifically, the invention relates to back-drilling the VIA to create a countersunk VIA channel.

In a printed circuit board (PCB), a VIA is a conducting channel between two or more substrate layers to make signal connections between different layers of the PCB. If the connection formed by a VIA is near one surface of the PCB, then the part of the VIA extending away from the connection to the opposite surface of the PCB forms a stub, which can cause a deterioration in signal integrity. Back-drilling is a process to remove the stub to improve signal integrity.

BRIEF SUMMARY

The invention comprises a method, computer program product, and system for modification to the VIA to mitigate or eliminate interference to signal integrity caused by a conductive VIA stub.

A method, computer program product, and system are provided for drilling a VIA through the PCB that supports improved signal integrity while still providing a location for accessing the signal with a test probe. The VIA is drilled to extend through the opposing sides of the PCB. After an opening having a uniform or relatively uniform sizing is created, the VIA is countersunk from one of the sides of the PCB. The process of countersinking forms a shoulder within the interior channel of the VIA. The shoulder separates the VIA into two sections, the countersunk section having a larger annular opening than the non-countersunk section. The process of countersinking completes the shape of the VIA, which is followed by plating the interior walls of the VIA with a conductive material. To form a test target in the VIA, the VIA is back-drilled from the opening adjacent to the section of the VIA having the larger opening. The back-drilling is limited to the interior walls of the larger opening and does not include the shoulders. After the back-drilling is complete, a test probe may be inserted through the VIA from the opening adjacent to the section of the VIA having the larger opening and extending to the shoulder.

Other features and advantages of this invention will become apparent from the following detailed description of the presently preferred embodiment(s) of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated.

DETAIL DESCRIPTION

It will be readily understood that the components of the present invention, as generally described and illustrated in the FIGS. herein may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in a suitable manner in one or more embodiments. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

Figure 1:
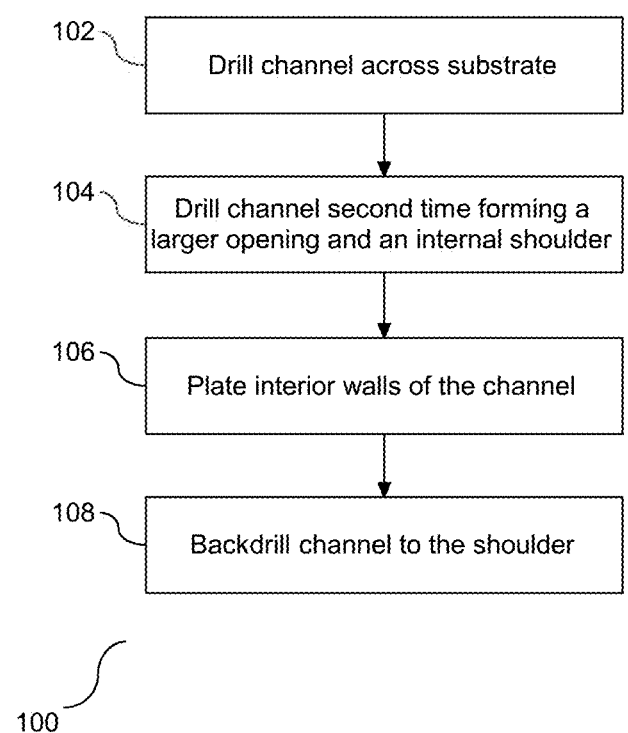
FIG. 1 depicts a flow chart illustrating a process for creating a test target which can be used for performing an In Circuit Test (ICT) on a Printed Circuit Board (PCB).

Referring to FIG. 1, a flow chart (100) is provided to illustrate a process for creating a test target which can be used for performing an In Circuit Test (ICT) on a Printed Circuit Board (PCB). A channel is drilled across the length of a substrate (102), from a first side of the substrate to a second side of the substrate. In one embodiment, the channel is referred to as a vertical interconnect access (VIA). In a printed circuit board, the VIA is a conducting channel between two or more substrate layers. The VIA is created by drilling through the board at the appropriate place where two or more layers will interconnect and allowing a conductive material, such as copper, to run through the channel. In one embodiment, the conductive material only coats the sides of the channel. Following step (102) and before lining the channel with any material, the channel is drilled from one of the first or second sides of the substrate (104), the drilling forming a larger opening into and through a portion of the channel. In one embodiment, the drilling process at step (104) takes place from first side of the substrate and the second side of the substrate receives hardware elements, such as chips, connectors, memory modules, etc. Furthermore, in one embodiment, the drilling at step (104) removes any unused portion of the VIA, such as any conductive material on the first side of the substrate adjacent to the channel. Accordingly, after the channel is formed by a first drilling procedure, the channel is drilled a second time through a second drilling process to form a larger opening within a portion of the channel from one of the sides of the substrate.

The process of second drilling of the channel forms an interior shoulder within the channel. In one embodiment, the second drilling includes precision so that the shoulder formed within the channel is adjacent to a copper trace within the substrate. The trace is a conductive path embedded in a layer of the PCB and forms a circuit when electronic components are soldered to it. The geometrical configuration and the angles formed between the channel and the shoulder are described below in detail in FIG. 3. Following step (104), the channel is plated across the length of the substrate (106), the plating extending from the opening adjacent to the first side to the opening adjacent to the second side. In one embodiment, the plating material is a conductive material, such as copper. Following the plating of the channel, the channel is back drilled from the first side of the substrate to the shoulder (108), e.g. from the side of the substrate having a larger opening formed by the second drilling process. The back-drilling at step (108) is limited to the enlarged channel and does not include the shoulder or associated shoulder walls formed by the second drilling process. Accordingly, the formation of the channel with the second drilling process and the back-drilling of a select section of the channel provide an area within the channel with a conductive surface which can be used as a test target.

Figure 2:
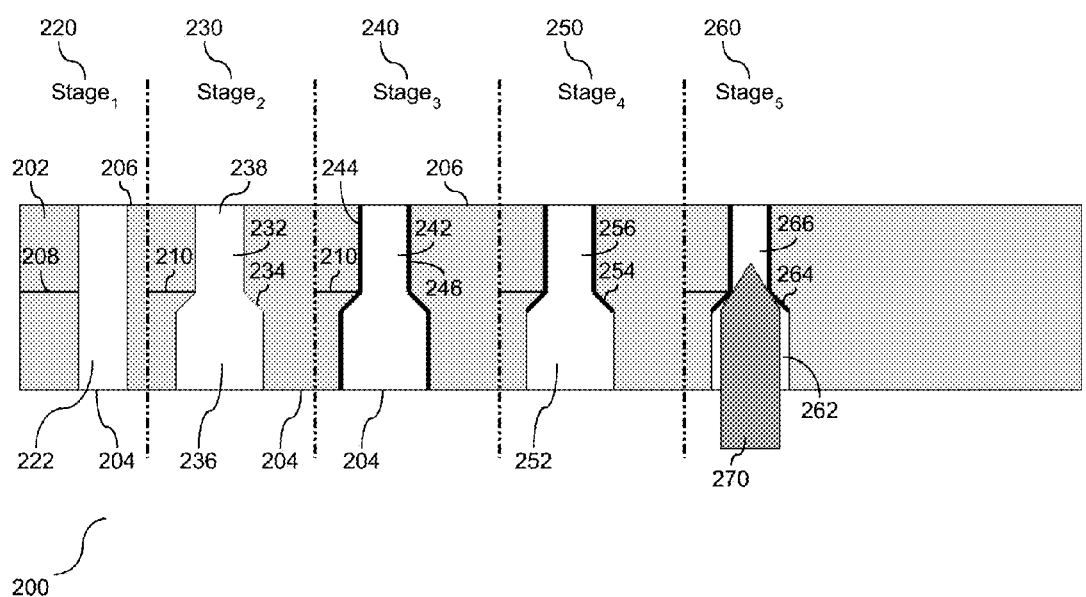
FIG. 2 depicts a block diagram illustrating the formation and modification of the channel through the steps described in detail in FIG. 1.

Referring to FIG. 2, a block diagram (200) is provided to illustrate the formation and modification of the channel through the steps described in detail in FIG. 1, As shown, there are five stages to the channel formation. The first stage (220), stage$_1$, shows the first drilling process where the channel (222) is formed. As shown, the channel is drilled through the substrate (202) and extends from a first side (204) of the substrate to a second side of the substrate (206). In addition, a trace (208) is shown within the substrate, and will be discussed in detail with respect to the subsequent stages. Following the completion of the first stage (220), the second drilling operation takes place. The second stage (230), stage$_2$, shows the completion of the second drilling process and the formation of a shoulder (234) within the channel (232). As shown herein, the second drilling process enlarges the opening of the channel from the first side (204) until the shoulder (234). From the opposite side of the substrate, e.g. the second side of the substrate, the opening of the channel remains the same size as with the first drilling process. The shoulder (234) shown herein as an angled wall that extends from the enlarged opening (236) to the narrower opening (238) associated with first drilling process. Furthermore, as shown, the shoulder (234) ends where the trace (210) meets the wall of the channel. Accordingly, the shoulder of the channel is configured with respect to the substrate, and specifically, the location of the trace within the substrate.

As noted above, the channel being formed functions as a VIA in a PCB, which is a conducting pathway in the PCB. The third stage (240), stage$_3$, shows the plating of the channel (242). As shown, the walls (244) of the channel (242) are plated (246) with a conductive material. In one embodiment, the conductive material is copper. The plating (246) extends along an interior surface of the channel (242) from the opening adjacent to the first side (204) to the opening adjacent to the second side (206). The fourth stage (250), stage$_4$, shows back-drilling a select portion of the plated channel. Back-drilling enlarges the opening of the channel by removing the plated material from the walls. As shown herein, there are three sections of channel walls, the enlarged section (252), the shoulder (254), and the original narrower section (256). The back-drilling of the channel is limited to the enlarged section (252). Specifically, the back-drilling removes the plated material from the interior surface of the channel in the enlarged section (252). The lining of the shoulder (254) and the original narrower section (256) with the plated conductive material remains intact.

Referring to the fifth and final stage (260), stage$_5$, a probe may be inserted into the channel. As shown, the back-drilling channel has a larger section (262), a shoulder (264), and a narrower section (266). The interior walls of the larger section (262) do not have conductive material, as this was removed in stage$_4$(250). The interior walls of the shoulder (264) and section (266) remain lined with a conductive material. The opening of the larger section (262) is sized to receive the probe (270). At the same time, the probe (270) is larger than the opening provided by the narrower section (266). When inserted into the channel, the probe (270) intersects with the shoulder (264), and in one embodiment, without contacting the walls of the larger section (262). Accordingly, the formed channel is configured to receive the probe (270) inserted through the larger section (262), with the probe (270) in contact with the shoulder (264).

Figure 3:
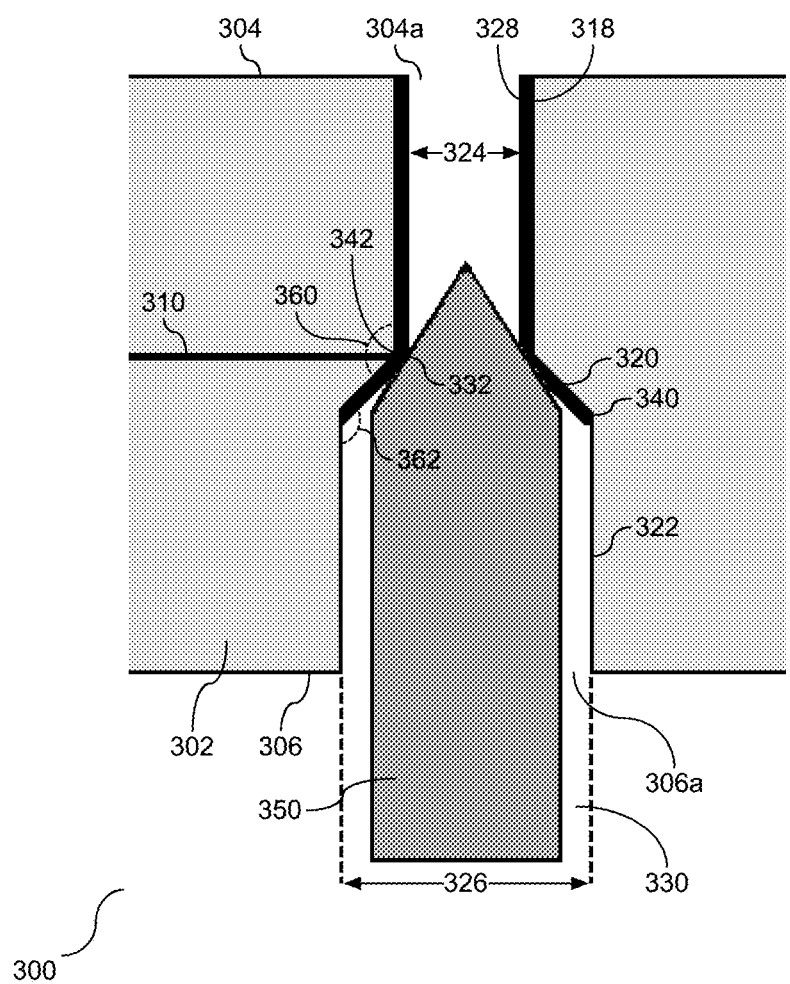
FIG. 3 depicts a sectional view of the formed channel provided with respect to the PCB.

Referring to FIG. 3, a sectional view (300) of the formed channel is provided with respect to a substrate, e.g. a PCB. As shown, the channel (330) extends from a first surface (306) of the PCB (302) to a second surface (304) of the PCB (302). Two openings to the channel (330) are shown. A first opening (306a) is provided adjacent to the first surface (306) and a second opening (304a) is provided adjacent to the second surface (304). The first opening (306a) has a first width shown at (326), and a second opening (304a) having a second width shown at (324). In one embodiment, the first and second openings are circular and the size of the respective openings refers to the diameter. A trace (310) is shown embedded in the PCB (302). A first section (322) of the opening extends from the first surface (306) to the first edge (340) of the shoulder (320). Similarly, a second section (318) of the opening extends from the second surface (304) to the second edge (342) of the shoulder (320). Interior surfaces of the shoulder (320) and the second section (318) are lined with a conductive material. However, the interior surfaces of the first section (322) are not lined with a conductive material.

Furthermore, as shown, a trace (310) internal to the PCB (302) is shown. The trace (310) intersects the shoulder (320) at or near (342) on the second section (318). The shoulder (320) supports and is configured to receive a test probe (350). As shown, there is no conductive material, such as an annular ring comprised of conductive material, adjacent to the opening (306a). At such time as the probe (350) is inserted in the channel and received through the first opening formed through the first surface (306), contact of the probe with a conductive material is limited to the shoulder (320). Accordingly, interference with signal integrity is mitigated through the structure of the channel and the associated shoulder.

As shown, an exterior obtuse angle (360) is formed between the second section (318) and the shoulder (320), and an interior obtuse angle (362) is formed between the first section (322) and the shoulder (320). Furthermore, the trace (310) intersects an exterior wall of the channel at the junction (342) of the second section (318) and the shoulder (320) or close to shoulder (342) on the second section (318). The size of these obtuse angles (360) and (362) enables enough accessible area of conducting material on the shoulder (320) for the test probe (350) to be inserted into the channel and make contact with minimal or no interference with signal integrity.

As shown in FIGS. 1-3, an additional drilling step is employed to form the shoulder within the VIA. In one embodiment, and as described herein, the shoulder is formed before the plating of the conductive material. The formation of the shoulder and the manner in which the VIA is plated enables the shoulder to be used as a test target. As further disclosed herein, the position placement of the shoulder during the countersinking includes configuring the shoulder to intersect with a trace internal to the PCB.

Figure 4:
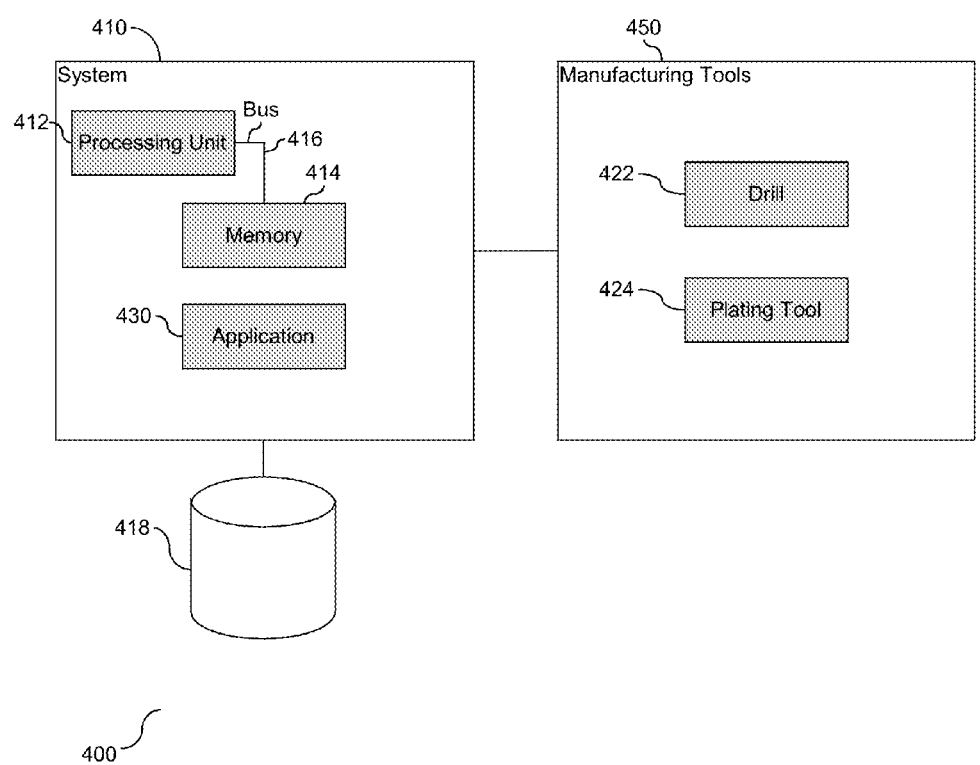
FIG. 4 depicts a block diagram illustrating tools embedded in a computer system to support and enable creation of the channel shown in FIG. 3.

Reference is made to a system having components to implement the process of forming the channel shown in FIG. 1 with the outcome of the formed channel shown in FIG. 3. FIG. 4 is a block diagram (400) illustrating tools embedded in a computer system to support and enable creation of the channel shown in FIG. 3. As shown, a computer system (410) is provided in communication with a set of manufacturing tools (450). The system (410) is provided with a processing unit (412) operatively coupled to memory (414) across a bus (416). In one embodiment, the system is provided with local data storage (418) or in one embodiment a remote data center (not shown) or a shared pool of resources (not in communication with the system (410) across a network connection.

The system (410) is shown with tools (450) in communication with the processing unit (412) to create the channel, e.g. VIA, in the PCB. As shown, the tools include, but are not limited to a drilling machine (422), and plating tool (424). An application (430) is shown local to the system (410) and functions to communicate with the drilling machine (422) and the plating tool (424). The application (430) controls selection of a drill bit and placement of the VIAs to be formed in the PCB. In one embodiment, the PCB is defined as a coordinate plane, with one or coordinate locations selected for drilling the VIA. The formation of the VIA is employs a computer controlled drilling machine. The application (430) employs the selected drill bit to form the VIAs at the defined coordinate locations. The application (430) includes instructions for an additional step in the drilling process to form the shoulder in the VIA, as described in FIGS. 1-3. In one embodiment, the application (430) activates the drill (422) a first time and forms a channel through the PCB. After the first channel is completed, the application activates the drill (422) a second time and countersinks the channel forming a shoulder within the channel. Accordingly, the shoulder is formed as a part of the drilling instruction received from the application.

Once the drill (422) has completed the countersinking, the application (430) communicates with the plating tool (424) to line the interior walls of the countersunk channel with a conductive material. After the lining is completed, the application (430) again communicates with the drill (422) to remove the conductive material from the interior walls of the channel in the opening from the first side of the PCB, and at the same time keeping the conductive material on the walls of the shoulder and the narrower channel opening. Accordingly, the application (430) communicates with the manufacturing tools to provide a computer automated system for back-drilling a VIA in a PCB.

As identified above, the application (430) is shown residing local to the system (410). In one embodiment, the application (430) may reside as one or more applications local to memory (414) or as one or more hardware tools external to the memory (424). In another embodiment, the application (430) may be implemented as a combination of hardware and software. In the case of an embodiment with a pool of shared resources, such as a cloud computing environment, the application (430) may be collectively or individually distributed across the shared pool of computer resources and function as a unit to support automated back-drilling of a PCB VIA. Accordingly, the application (430) may be implemented as one or more software tools, hardware tools, or a combination of software and hardware.

The system described above in FIG. 4 has been labeled with an application and tools in the form of a conveyor, a drilling tool, and a plating tool. The tools may be implemented in programmable hardware devices such as field programmable gate arrays, programmable array logic, programmable logic devices, or the like. The tools may also be implemented in software for execution by various types of processors. An identified functional unit of executable code may, for instance, comprise one or more physical or logical blocks of computer instructions which may, for instance, be organized as an object, procedure, function, or other construct. Nevertheless, the executable of the tools need not be physically located together, but may comprise disparate instructions stored in different locations which, when joined logically together, comprise the tools and achieve the stated purpose of the tool.

Indeed, executable code could be a single instruction, or many instructions, and may even be distributed over several different code segments, among different applications, and across several memory devices. Similarly, operational data may be identified and illustrated herein within the tool, and may be embodied in any suitable form and organized within any suitable type of data structure. The operational data may be collected as a single data set, or may be distributed over different locations including over different storage devices, and may exist, at least partially, as electronic signals on a system or network.

Furthermore, the described features, structures, or characteristics may be combined in any suitable manner in one or more embodiments. In the following description, numerous specific details are provided, such as examples of agents, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Figure 5:
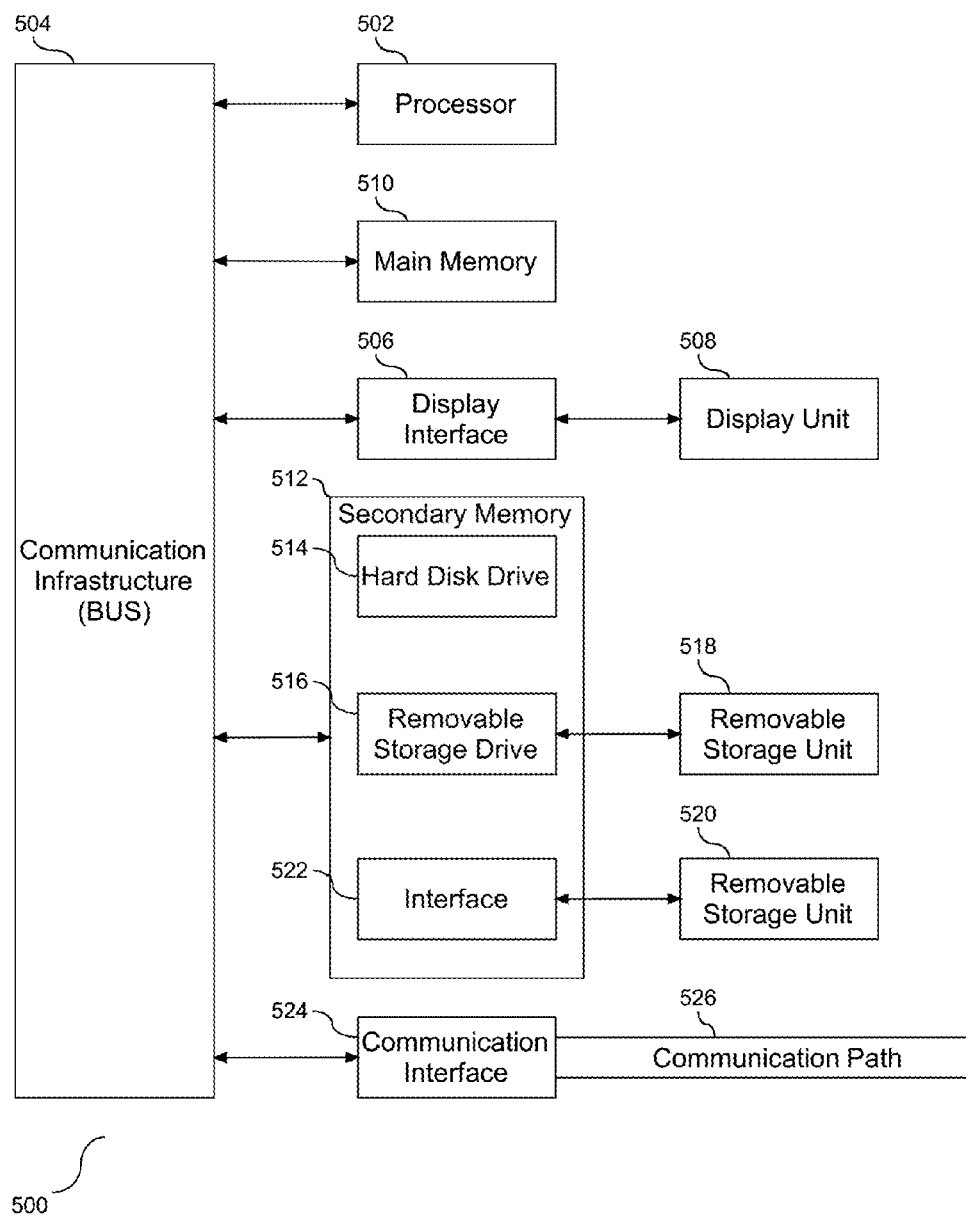
FIG. 5 depicts a block diagram of a computing environment according to an embodiment of the present invention.

Referring now to the block diagram of FIG. 5, additional details are now described with respect to implementing an embodiment of the present invention. The computer system includes one or more processors, such as a processor (502). The processor (502) is connected to a communication infrastructure (504) (e.g., a communications bus, cross-over bar, or network).

The computer system can include a display interface (506) that forwards graphics, text, and other data from the communication infrastructure (504) (or from a frame buffer not shown) for display on a display unit (508). The computer system also includes a main memory (510), preferably random access memory (RAM), and may also include a secondary memory (512). The secondary memory (512) may include, for example, a hard disk drive (514) and/or a removable storage drive (516), representing, for example, a floppy disk drive, a magnetic tape drive, or an optical disk drive. The removable storage drive (516) reads from and/or writes to a removable storage unit (518) in a manner well known to those having ordinary skill in the art. Removable storage unit (518) represents, for example, a floppy disk, a compact disc, a magnetic tape, or an optical disk, etc., which is read by and written to by removable storage drive (516). As will be appreciated, the removable storage unit (518) includes a computer readable medium having stored therein computer software and/or data.

In alternative embodiments, the secondary memory (512) may include other similar means for allowing computer programs or other instructions to be loaded into the computer system. Such means may include, for example, a removable storage unit (520) and an interface (522). Examples of such means may include a program package and package interface (such as that found in video game devices), a removable memory chip (such as an EPROM, or PROM) and associated socket, and other removable storage units (520) and interfaces (522) which allow software and data to be transferred from the removable storage unit (520) to the computer system.

The computer system may also include a communications interface (524). Communications interface (524) allows software and data to be transferred between the computer system and external devices. Examples of communications interface (524) may include a modem, a network interface (such as an Ethernet card), a communications port, or a PCMCIA slot and card, etc. Software and data transferred via communications interface (524) is in the form of signals which may be, for example, electronic, electromagnetic, optical, or other signals capable of being received by communications interface (524). These signals are provided to communications interface (524) via a communications path (i.e., channel) (526). This communications path (526) carries signals and may be implemented using wire or cable, fiber optics, a phone line, a cellular phone link, a radio frequency (RF) link, and/or other communication channels.

In this document, the terms "computer program medium," "computer usable medium," and "computer readable medium" are used to generally refer to media such as main memory (510) and secondary memory (512), removable storage drive (516), and a hard disk installed in hard disk drive (514).

Computer programs (also called computer control logic) are stored in main memory (510) and/or secondary memory (512). Computer programs may also be received via a communication interface (524). Such computer programs, when run, enable the computer system to perform the features of the present invention as discussed herein. In particular, the computer programs, when run, enable the processor (502) to perform the features of the computer system. Accordingly, such computer programs represent controllers of the computer system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the Figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, the modification and back-drilling of the VIA supports receipt of an ICT test probe, or an equivalent or alternate probe, and at the same time mitigates or eliminates signal integrity degradation caused by a conductive VIA stub.

Alternative Embodiment

It will be appreciated that, although specific embodiments of the invention have been described herein for purposes of illustration, various modifications may be made without departing from the spirit and scope of the invention. In particular, in one embodiment the plating of the internal walls of the VIA may remain, thereby having a conductive plating that extends the length of the interior walls of the VIA. Similarly, in one embodiment, a VIA may exist with a uniform thickness and plating extending the length of the interior VIA walls. In this embodiment, the process of modifying the VIA includes removing the plating, followed by countersinking and re-plating. Accordingly, the scope of protection of this invention is limited only by the following claims and their equivalents.

We claim:

1. A method comprising:
   drilling a vertical interconnect access (VIA) through a printed circuit board (PCB), the PCB having a first side and a second side;
   countersinking the VIA from the first side, the countersinking forming an interior shoulder extending between a first end and a second end, the shoulder located between the first side and the second side in the PCB;
   plating the VIA with a conductive material, the plating extending a length of the VIA, including plating the shoulder;
   forming a test target in the VIA, including back-drilling the VIA from the first side, the back-drilling removing the conductive material from an interior wall of the VIA extending from the first side to the first end of the plated shoulder, wherein the plated shoulder remains intact in the PCB after back-drilling.

2. The method of claim 1, further comprising inserting an in-circuit test probe through the first side, including limiting contact of the probe within the VIA to the plated shoulder.

3. The method of claim 2, wherein back-drilling the VIA includes limiting the conductive plate material remaining within the VIA to the plated shoulder and the interior wall extending from the VIA to the second side of the PCB.

4. The method of claim 3, wherein the plated shoulder provides a surface to make contact with the tester.

5. The method of claim 4, further comprising positioning placement of the shoulder during countersinking, the placement position including the shoulder intersecting with a trace internal to the PCB.

6. The method of claim 1, wherein back-drilling the VIA from the first side further comprising removing a VIA stub formed by plating the VIA.

7. The method of claim 1, wherein plating the VIA is limited to a single instance.

8. The method of claim 1, wherein the countersinking further comprises:
   forming a first section and a second section, wherein the first section is proximal to the first side of the PCB and the second section is proximal to the second side of the PCB, wherein the shoulder is between the first and second sections and forms an exterior obtuse angle with the first and second sections.

9. The method of claim 1, wherein the plated shoulder further comprises a plating layer and a PCB layer underneath the plating layer.

10. The method of claim 9, wherein the plating layer is adjacently positioned to the PCB layer.

11. The method of claim 1, wherein the shoulder has a first and second end, and the second end is proximal to a trace internal to the PCB.

12. The method of claim 1, wherein the countersinking occurs before the plating.

13. A vertical interconnect access (VIA) created by the process of:
   drilling the VIA through a printed circuit board (PCB), the circuit board PCB having a first side and a second side;
   countersinking the VIA from the first side, the countersinking forming an interior shoulder extending between a first end and a second end, the shoulder located between the first side and the second side within the PCB;
   plating the VIA with a conductive material, the plating extending a length of the VIA including plating the formed shoulder;
   forming a test target in the VIA, including back-drilling the VIA from the first side, the back-drilling removing the conductive material from an interior wall of the VIA extending from the first side to the first end of the plated shoulder, wherein the plated shoulder remains intact in the PCB after back-drilling.

14. The method of claim 8, wherein the shoulder between the first and second sections remains plated after back-drilling.

15. The method of claim 8, wherein the first section extends from the first side of the PCB to the intact plated shoulder and the second section extends from the second side of the PCB to the intact plated shoulder.

16. The method of claim 15, wherein the intact plated shoulder has a length which extends from the first section to the second section.

17. The method of claim 15, further comprising positioning placement of the interior shoulder in the PCB during countersinking, the placement position including a junction of the interior shoulder in the PCB and the second section, the junction intersecting with a trace internal to the PCB.

18. The method of claim 1, wherein the interior shoulder in the PCB remains intact after back-drilling.

* * * * *